(12) United States Patent
Schmidt (10) Patent No.: US 10,192,974 B2
(45) Date of Patent: Jan. 29, 2019

(54) METHOD FOR FORMING A SEMICONDUCTOR DEVICE AND A SEMICONDUCTOR SUBSTRATE

(71) Applicant: INFINEON TECHNOLOGIES AG, Neubiberg (DE)

(72) Inventor: Gerhard Schmidt, Wernberg-Wudmath (AT)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 14/960,261

(22) Filed: Dec. 4, 2015

(65) Prior Publication Data

US 2016/0181104 A1 Jun. 23, 2016

(30) Foreign Application Priority Data

Dec. 18, 2014 (DE) .................. 10 2014 119 088

(51) Int. Cl.
*H01L 21/04* (2006.01)
*H01L 29/66* (2006.01)
(Continued)

(52) U.S. Cl.
CPC ...... *H01L 29/66666* (2013.01); *H01L 21/221* (2013.01); *H01L 21/26506* (2013.01); *H01L 29/1095* (2013.01); *H01L 29/167* (2013.01); *H01L 29/66333* (2013.01); *H01L 29/66712* (2013.01); *H01L 29/7395* (2013.01); *H01L 29/7802* (2013.01); *H01L 29/7827* (2013.01); *H01L 29/6609* (2013.01); *H01L 29/861* (2013.01)

(58) Field of Classification Search
CPC ............. H01L 21/2251; H01L 29/7395; H01L 29/1095; H01L 29/167; H01L 29/861; H01L 29/7827; H01L 29/6629; H01L 29/66333; H01L 29/66666; H01L 21/221; H01L 21/26506; H01L 29/6609
USPC ........ 438/510, 514, 530, 543; 257/139, 607, 257/610, 612, E21.334
See application file for complete search history.

(56) References Cited

U.S. PATENT DOCUMENTS 6,800,504 B2 * 10/2004 Li ................... C23C 14/0623
257/E27.004
7,426,128 B2 * 9/2008 Scheuerlein ........ H01L 45/1675
257/E27.004
(Continued)

FOREIGN PATENT DOCUMENTS

DE 10 2008 049 663 B4 4/2010
DE 10 2012 102 341 A1 10/2012

OTHER PUBLICATIONS

Schmidt et al. *Electronically activated boron-oxygen related combination centers in crystalline silicon.* Journal of Applied Physics 99, 013701 (2006).
(Continued)

*Primary Examiner* — Thinh T Nguyen
(74) *Attorney, Agent, or Firm* — Murphy, Bilak & Homiller, PLLC (57) ABSTRACT

A method for forming a semiconductor device includes incorporating chalcogen dopant atoms into a semiconductor doping region of a semiconductor substrate of a semiconductor device. The method further includes incorporating heavy metal atoms into the semiconductor doping region.

19 Claims, 5 Drawing Sheets

(51) Int. Cl.
*H01L 29/739* (2006.01)
*H01L 29/10* (2006.01)
*H01L 29/167* (2006.01)
*H01L 29/78* (2006.01)
*H01L 21/22* (2006.01)
*H01L 21/265* (2006.01)
*H01L 29/861* (2006.01)

(56) References Cited

U.S. PATENT DOCUMENTS

| | | | |
|---|---|---|---|
| 8,178,386 B2 * | 5/2012 | Lung | H01L 27/2436 257/214 |
| 8,361,893 B2 * | 1/2013 | Schmidt | H01L 21/223 257/E21.068 |
| 2003/0186504 A1 * | 10/2003 | Li | C23C 14/0623 438/257 |
| 2004/0097047 A1 * | 5/2004 | Natzle | H01L 21/28035 438/300 |
| 2007/0008773 A1 * | 1/2007 | Scheuerlein | G11C 13/0007 365/161 |
| 2008/0296612 A1 | 12/2008 | Schmidt | |
| 2009/0072216 A1 * | 3/2009 | Lung | H01L 27/2436 257/4 |
| 2010/0290271 A1 * | 11/2010 | Lung | G11C 11/5614 365/163 |
| 2012/0097906 A1 * | 4/2012 | Snyder | C01B 19/002 252/519.14 |
| 2012/0248576 A1 * | 10/2012 | Schmidt | H01L 21/223 257/607 |
| 2012/0306046 A1 * | 12/2012 | Schmidt | H01L 29/0638 257/506 |
| 2013/0256609 A1 * | 10/2013 | Ren | H01L 35/16 252/519.14 |
| 2014/0065763 A1 * | 3/2014 | Foust | H01L 21/02052 438/95 |
| 2014/0065799 A1 * | 3/2014 | Ahmed | H01L 21/3003 438/477 |
| 2015/0008492 A1 * | 1/2015 | Koike | H01L 21/26506 257/288 |
| 2015/0214479 A1 * | 7/2015 | Lung | H01L 45/06 365/163 |

OTHER PUBLICATIONS

Badr et al. *Deep Energy Levels of Platinum-Hydrogen Complexes in Silicon.* Solid State Phenomena vols. 205-206 (2014) pp. 260-264.
Hazdra et al. *Hydrogenation of platinum introduced in silicon by radiation enhanced diffusion.* Materials Science and Engineering B 159-160 (2009) pp. 342-345.
Kveder et al. *Recombination activity of contaminated dislocations in silicon: A model describing electron-beam-induced current contrast behavior.* Physical Review B, vol. 63, 115208.
Rao et al. *Identification of the nature of platinum related midgap state in silicon by deep level transient spectroscopy.* Journal of Applied Physics 85, 2175 (1999); doi: 1063/1.369523.

* cited by examiner

METHOD FOR FORMING A SEMICONDUCTOR DEVICE AND A SEMICONDUCTOR SUBSTRATE

BACKGROUND

The present application claims priority under 35 USC § 119 to German (DE) Patent Application Serial No. DE 10 2014 119 088.2 filed on Dec. 18, 2014. The disclosure in this priority application is hereby incorporated fully by reference into the present application.

TECHNICAL FIELD

Embodiments relate to producing semiconductor devices and in particular to a method for forming a semiconductor device and a semiconductor substrate.

BACKGROUND ART

Float Zone (FZ) silicon may be used as a substrate material for silicon (Si) power components. The use of FZ materials for the production of transistors (e.g. IGBTs) and diodes are limited by cost and wafer size. Czochralski (CZ) Materials or less expensive and larger wafer diameters are possible. However, CZ materials suffer from higher contamination from oxygen in comparison to FZ material, due to the high reactivity of Silicon. Oxygen is reduced in Magnetic Czochralski (MCZ) Materials (e.g. MCZ Si), but MCZ Si may still have higher interstitial oxygen [Oi] concentration in comparison to FZ Si. Interaction of oxygen with dopants may lead to degradation of the carrier life time in semiconductor devices, for example.

SUMMARY

Some embodiments relate to a method for forming a semiconductor device. The method includes incorporating chalcogen dopant atoms into a semiconductor doping region of a semiconductor substrate of a semiconductor device. The method further includes incorporating heavy metal atoms into the semiconductor doping region.

Some embodiments related to a semiconductor substrate. The semiconductor substrates includes a semiconductor doping region comprising chalcogen dopant atoms at a first dopant concentration and heavy metal atoms at a second dopant concentration.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
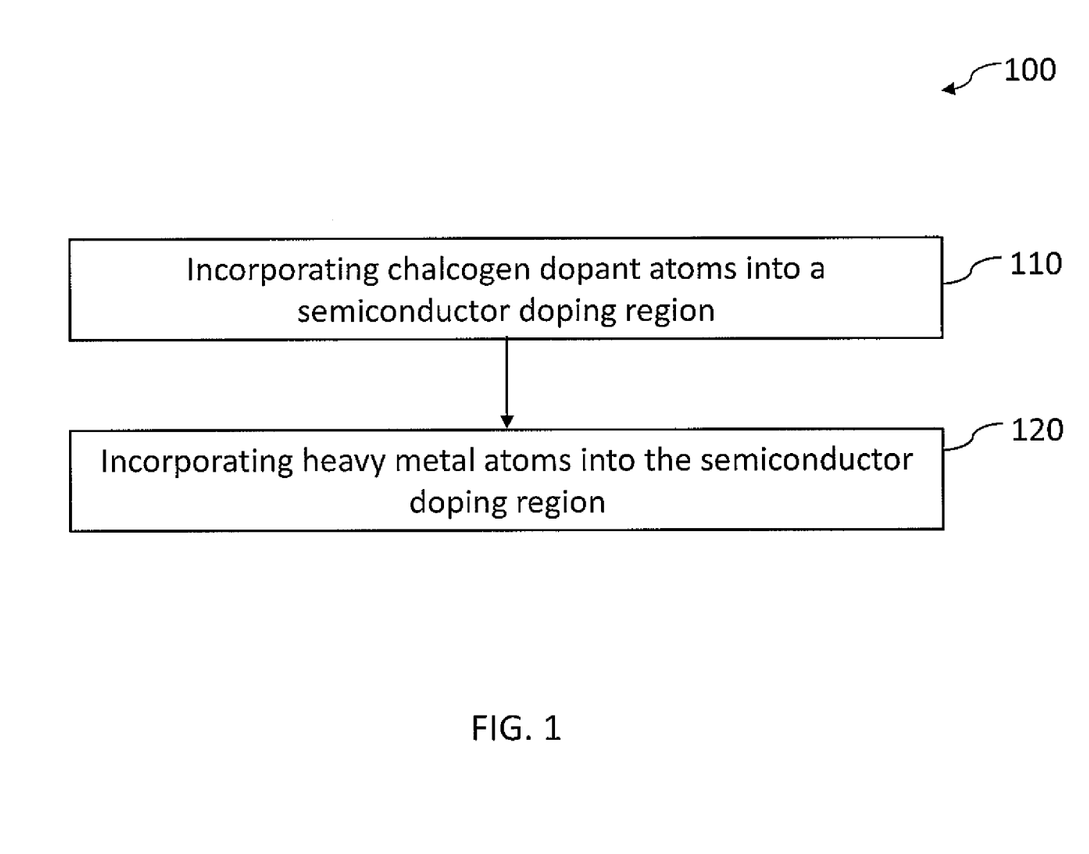
FIG. 1 shows a schematic illustration of a method for forming a semiconductor device.

FIG. 1 shows a flow chart of a method 100 for forming a semiconductor device according to an embodiment.

The method 100 includes incorporating 110 chalcogen dopant atoms into a semiconductor doping region of a semiconductor substrate of a semiconductor device.

The method 100 further includes incorporating 120 heavy metal atoms into the semiconductor doping region.

Due to the incorporation of chalcogen dopant atoms and heavy metal atoms into the semiconductor doping region, the performance (e.g. switching behavior) of semiconductor devices (e.g. diodes, free-wheeling diodes or transistors) may be improved and degradation in semiconductor devices due to an undesirable formation of complexes may be reduced. Furthermore, doping values and minority carrier lifetime values may be reliably controlled with little dependence on impurities (e.g. oxygen values) in the semiconductor substrate, for example.

The semiconductor substrate may be part of a semiconductor wafer or part of a semiconductor die, for example. The semiconductor substrate may be a silicon-based semiconductor substrate. For example, the semiconductor substrate may be a float zone (FZ) silicon substrate, a Czochralski (CZ) silicon substrate or a magnetic Czochralski (MCZ) silicon substrate, for example.

In an example, the semiconductor substrate (e.g. before incorporating the chalcogen dopant atoms and before incorporating the heavy metal atoms) may include silicon (or be a silicon substrate) having an electrical resistivity between 500 Ωcm and 100 Ωcm, or e.g. greater than 10000 Ωcm, or e.g. greater than 5000 Ωcm, e.g. 5700 Ωcm. The semiconductor substrate may include an oxygen interstitial content between $1\times10^{17}$ cm$^{-3}$ and $1\times10^{18}$ cm$^{-3}$, for example. Such a semiconductor substrate may be a silicon substrate produced by an MCZ or a CZ process, for example.

Alternatively, the semiconductor substrate (e.g. before processing) may include (FZ) silicon having an electrical resistivity greater than 1000 Ωcm, or e.g. between 1000 Ωcm and 3000 Ωcm, for example. The (FZ) semiconductor substrate may include an oxygen interstitial content of less than $1\times10^{16}$ cm$^{-3}$, for example. The FZ Si may have lower oxygen concentration, but higher cost and difficulties with larger wafer sizes.

Although a silicon or silicon-based substrate is used in the examples described herein, the semiconductor substrate is not necessarily limited to being a silicon or silicon-based substrate, and may, in alternative examples, be a silicon carbide-based semiconductor substrate, a gallium arsenide-based semiconductor substrate, or a gallium nitride-based semiconductor substrate, for example.

Additionally or optionally, the semiconductor substrate (e.g. before processing according to the method 100) may be an undoped (intrinsic) semiconductor wafer having a substantially equal number of charge carriers of a first charge carrier type (e.g. holes) and charge carriers of a second charge carrier type (e.g. electrons), for example.

The chalcogen dopant atoms may include elements from group 16 of the periodic table. For example, chalcogen dopant atoms may be selenium (Se) atoms, tellurium (Te) atoms or sulfur (S) atoms. The chalcogen dopant atoms may consist of chalcogen dopant atoms of the same chalcogen element (e.g. Se atoms only, or Te atoms only or S atoms only). Alternatively, the chalcogen dopant atoms may include a mixture of different chalcogen atoms, for example.

The chalcogen dopant atoms (e.g. Se) may be incorporated into the semiconductor doping region by ion implantation and/or diffusion, for example. In an ion implantation, the chalcogen dopant atoms may be implanted at a dosage concentration between $6\times10^{13}$ cm$^{-2}$ and $5\times10^{14}$ cm$^{-2}$, or e.g. between $1\times10^{14}$ cm$^{-2}$ and $5\times10^{14}$ cm$^{-2}$, e.g. at $3\times10^{14}$ cm$^{-2}$. An implantation energy of at least 150 keV may be used for the implantation. An implantations depth may be between 30 nm to 100 nm, for example.

The chalcogen dopant atoms may be incorporated to a dopant depth of between 20 μm to 500 μm, or e.g. 50 μm to 150 μm, e.g. 120 μm, from a first side or surface (e.g. a front side or surface) of the semiconductor substrate by a deep diffusion (transport or movement) of the chalcogen dopant atoms into the semiconductor doping region, for example. The deep diffusion may be carried out by heating (or annealing) the semiconductor substrate (e.g. up to or at a temperature between 1000° C. and 1200° C.) for the deep diffusion of the chalcogen dopant atoms into the semiconductor doping region after the implantation of the dopant atoms. The (final) dopant depth reached by the chalcogen dopant atoms by deep diffusion may be greater than the depth reached by the chalcogen dopant atoms by ion implantation without diffusion, e.g. 500 to 5000 times greater, or e.g. 500 to 2000 times greater, or e.g. 1000 times greater, for example.

The chalcogen dopant atoms may be incorporated into the semiconductor doping region at a first average dopant concentration. For example, the first average dopant concentration of chalcogen dopant atoms incorporated in the semiconductor doping region may lie between $1\times10^{12}$ cm$^{-3}$ and $5\times10^{14}$ cm$^{-3}$, or e.g. between $5\times10^{13}$ cm$^{-3}$ and $5\times10^{14}$ cm$^{-3}$, e.g. at $1\times10^{14}$ cm$^{-3}$. At the dopant depth the first average dopant concentration or dopant concentration of the chalcogen dopant atoms may be substantially homogenous (e.g. dopant fluctuations or variations of not more than 10% from the first average dopant concentration value). The chalcogen dopant atoms in the semiconductor doping region may lead to the semiconductor doping region having a first conductivity type (e.g. n-type), for example.

The heavy metal atoms may be platinum atoms, palladium atoms or gold atoms. The heavy metal atoms may consist of heavy metal atoms of the same heavy metal element (e.g. Pt atoms), or alternatively may include atoms of different heavy metal atoms.

The heavy metal atoms (e.g. Pt atoms) may be incorporated into the semiconductor doping region by ion implantation and/or diffusion after the incorporation of chalcogen dopant atoms into the semiconductor doping region, for example. In an example, the heavy metal atoms may be implanted at a dosage concentration between $1\times10^{12}$ cm$^{-2}$ and $1\times10^{14}$ cm$^{-2}$, or e.g. between $2\times10^{12}$ cm$^{-2}$ and $5\times10^{13}$ cm$^{-2}$, e.g. at $3\times10^{12}$ cm$^{-2}$.

In an alternative example, diffusion of Pt into the semiconductor doping region may be carried out by forming a platinum silicide (PtSi) layer over a side or surface (e.g. the first side or front surface) of the semiconductor substrate by depositing a Pt layer. Heating the semiconductor substrate at a temperature greater than 600° C. (e.g. at about 800° C.) results in a diffusion of platinum out of the PtSi layer and into the semiconductor doping region, for example.

The implanted or diffused heavy metal atoms may be incorporated into the semiconductor doping region at a second average dopant concentration. The second average dopant concentration (of the heavy metal atoms) and the first average dopant concentration (of the chalcogen dopant atoms) may be different. For example, the first average dopant concentration may be greater than the second average dopant concentration. For example, the second average dopant concentration may lie between $5\times10^{11}$ cm$^{-3}$ and $1\times10^{14}$ cm$^{-3}$, or e.g. between $1\times10^{12}$ cm$^{-3}$ and $1\times10^{14}$ cm$^{-3}$, e.g. at $1\times10^{12}$ cm$^{-3}$.

At the dopant depth, e.g. at between 100 μm to 500 μm, or e.g. 100 μm to 150 μm, e.g. 120 μm from the first side or surface, the second average dopant concentration or dopant concentration of the heavy metal dopant atoms may be substantially homogenous (e.g. dopant fluctuations or variations of not more than 10% from the second average dopant concentration value). For example, the dopant concentration from the first surface to the dopant depth may decrease from $1\times10^{14}$ cm$^{-3}$ to a homogeneous $1\times10^{12}$ cm$^{-3}$ at the dopant depth.

The method 100 may additionally or optionally further include generating defects in the semiconductor doping region in order to improve the diffusion of dopant atoms to the desired dopant depth. For example, the method 100 may additionally or optionally further include generating defects in the semiconductor doping region so that the deep diffusion of the chalcogen dopant atoms into the semiconductor doping region may occur. The defects may be generated by supersaturating a silicon lattice of the semiconductor substrate with self-interstitials (e.g. by forming a defect-inducing layer over a side e.g. on a front main surface or a back main surface of the semiconductor substrate and in proximity to the semiconductor doping region). The defect-inducing layer may cause a stress to be applied to the semiconductor substrate, which may induce a formation of defects and/or interstitials (e.g. self-interstitials) in the semiconductor doping region, for example. The formation of interstitials and/or defects increases the diffusion depth and/or causes an accelerated diffusion of the chalcogen dopant atoms into the semiconductor doping region.

The defect-inducing layer may include any material, element or compound which causes a stress to be applied to the semiconductor substrate and to the semiconductor doping region. For example, the defect-inducing layer may be formed by providing phosphorous (e.g. P) dopant atoms for forming the defect-inducing layer comprising phosphorous (e.g. phosphoric glass). In an example, the defect-inducing layer may be formed on a side of the semiconductor substrate by providing phosphine ($PH_3$) or phosphorous oxychloride $POCl_3$ gas or another gaseous compound comprising phosphorous to the substrate at a temperature between 900° C. and 1050° C.

The defect-inducing layer may be formed before or during the incorporating of the chalcogen dopant atoms. In an example, the defect-inducing layer may be formed after the implantation of chalcogen dopant atoms, but before the heating or annealing of the semiconductor substrate for the in-diffusion (e.g. deep diffusion) of the chalcogen dopant atoms into the semiconductor doping region. The defect-inducing layer may be removed from the semiconductor substrate or may remain on the semiconductor substrate during the heating or annealing. In an alternative example, the defect-inducing layer may be formed before the chalcogen dopant atoms are implanted, e.g. by implantation of phosphorus ions into a surface region (e.g. of about 1 μm) of the semiconductor substrate. The defect-inducing layer may remain on the semiconductor substrate during the incorporation of the chalcogen dopant atoms, for example. Once the in-diffusion of the chalcogen dopant atoms has been carried out, the heavy metal atoms may be incorporated into the semiconductor doping region. The defect-inducing layer may be removed before or after the incorporation of the heavy metal atoms into the semiconductor doping region.

The method 100 may further include incorporating dopant atoms into one or more diode regions or transistor doping regions of the semiconductor device subsequent to the incorporation of the heavy metal atoms into the semiconductor doping region. For example, the one or more transistor doping regions may include source and/or drain regions of a transistor structure (e.g. of a metal oxide semiconductor field effect MOSFET) and/or a collector and/or emitter region of a bipolar transistor structure (e.g. of an insulated gate bipolar junction transistor structure IGBJT) and/or one or more body regions and/or well regions of a transistor structure, for example.

The dopant atoms for forming the one or more diode regions or transistor doping regions may be different from the chalcogen dopant atoms and the heavy metal atoms. For example, the dopant atoms for forming the one or more transistor doping regions may include boron (B) for p-type doping of the transistor doping regions and phosphorous (P) or Arsenic (As) for n-type doping of the transistor doping regions.

The formation of one or more transistor doping regions may be carried out at the first side (e.g. the front side). For example, in a lateral transistor structure, the transistor doping regions (e.g. the source/emitter transistor doping region, the drain/collector transistor doping region, body regions and/or well regions) may be formed by incorporating dopant atoms into the respective transistor doping regions.

Subsequently, one or more electrode regions may be formed by depositing metal (e.g. by sputtering or evaporation) on at least one transistor doping region (e.g. on a source/emitter transistor doping region and/or drain/collector transistor doping region) at the first side.

In a vertical transistor structure, a first transistor doping region (e.g. a source region or an emitter region) may first be formed at the first side (e.g. at the front side of the semiconductor substrate), for example. Subsequently, the metal layer (e.g. copper Cu or aluminum Al or any suitable metal) may be deposited to form a first electrode region contacting the first transistor doping region at the first side.

After deposition and structuring of the metallization layers at the first side, the method may further include thinning (e.g. backgrinding) the semiconductor substrate at a second side (e.g. the back side) of the semiconductor substrate. The semiconductor substrate may be thinned to a thickness between 40 μm and 500 μm, or e.g. between 40 μm and 200 μm, or e.g. between 40 μm and 150 μm. For example, a 600V device may have a thickness of about 60 μm.

The method may optionally further include forming a field stop doping region of the first conductivity type at the second side of the (thinned) semiconductor substrate. Forming the field stop doping region may include implanting protons (e.g. proton irradiation) and annealing the semiconductor substrate at a temperature between 400° C. and 500° C. The protons may be implanted from the second side (e.g. the back side) of the semiconductor substrate, for example, and may be implanted to a depth of between 30 μm and 100 μm, or e.g. between 30 μm and 100 μm, or e.g. between 30 μm and 50 μm from the second side of the semiconductor substrate. The field stop doping region may be formed directly adjacent to the semiconductor doping region, for example.

The method may further include incorporating dopant atoms (different from the chalcogen dopant atoms and the heavy metal atoms) into a second transistor doping region to form a second transistor doping region at the second side of the semiconductor substrate. The second transistor doping region may be formed over or directly on the field stop doping region. Laser thermal annealing (LTA) may be carried out before the metallization processes. For example, the method may further include depositing metal (e.g. back side metallization) to form a second electrode region contacting or on the second transistor doping region after the LTA process.

In some examples, the method 100 may include forming a semiconductor device which may include a diode, a transistor structure (e.g. a MOSFET structure or an IGBT structure) or a semiconductor power device.

For example, the semiconductor doping region may be formed as a doped body region of a MOSFET structure or as a doped drift region of an IGBT structure, for example. For example, the semiconductor doping region may lie between the first electrode region and the second electrode region.

To form a vertical IGBT structure, the method 100 may include forming the semiconductor doping region by incorporating the chalcogen dopant atoms and the heavy metal atoms into the semiconductor doping region. The method may include forming (e.g. subsequently) a transistor doping region (e.g. a body region) by incorporating dopant atoms (e.g. B) to form a body region of a second conductivity type (e.g. p-type), for example. The method may include forming the first transistor doping region (e.g. an emitter region) at the first side by incorporating dopant atoms (e.g. P or As) to form the first transistor doping region of a first conductivity type (e.g. n-type) at the first side, for example. The method may include forming the first transistor doping region at least partially in the body region and forming the body region above and/or (directly) adjacent to the semiconductor doping region, for example. The method may include forming a first electrode region at the first side of the semiconductor substrate contacting the first transistor doping region. The method may further include forming the field stop doping region of a first conductivity type (e.g. n-type) at the second side of the semiconductor substrate by an incorporation of protons into the semiconductor substrate. The method may include forming the field stop doping region adjacent (e.g. directly adjacent) to the semiconductor doping region. The method may include forming a second transistor doping region (e.g. a collector region) of a second conductivity type (e.g. a heavily doped p+-type region) adjacent (e.g. directly adjacent) to the field stop doping region at the second side of the semiconductor substrate. The method may include forming a second electrode region at the second side of the semiconductor substrate contacting the second transistor doping region.

In an example of the flow of processes according to method 100, a doping of Se atoms may be carried out by implanting between $1 \times 10^{14}$ cm$^{-2}$ to $5 \times 10^{14}$ cm$^{-2}$ (e.g. $3 \times 10^{14}$ cm$^{-2}$). This may be followed by a PH$_3$ diffusion between 900° C. and 1150° C., (e.g. 1000° to 1050° C.), which may be followed by a drive in the temperature range of between 1000° C. and 1200° C.

After the pre-diffusion, a process (e.g. a production or manufacturing process) of a diode (or transistor) with an emitter, and a Pt diffusion process may be carried out. The Pt diffusion may be carried out through a formation of a Pt silicide in a contact hole, which represents an infinite source, for example. A required Pt concentration in a base region for setting a forward voltage $V_F$ (of the semiconductor device) may be controlled by the Pt diffusions temperature, which may lie at about 857° C. for some diode types, for example.

After the metallization of the front side, thinning of the wafer may be carried out at the wafer end (e.g. at the wafer back side or second side) to a thickness of about 120 µm. This may be followed by the implantation of the backside emitter and laser annealing. The manufacturing of a back side field stop may be carried out by proton implantation and an annealing at 400° C. At this temperature, Pt—H-complexes in the proton field stop may be dissolved again. After the metallization of the back side, measurement of the static parameters in wafer test field may be carried out, for example.

For Si power components (semiconductor devices capable of supporting currents between 50 A to 100 A and voltages of between 500V to over 1000V), an n-doped, zone drawn Float Zone (FZ) basic material may be used (e.g. as a substrate material), for example. Phosphor may be added as a dopant material during the drawing processes to achieve the required specific resistance. Alternatively, for moderately low doping levels, neutron irradiation (e.g. neutron transmutation doping (NTD)) may be carried out, where over a core (nuclear) reactor, silicon cores may be converted to phosphorous cores. NTD leads to a very uniform doping over the silicon rod due to the small capture cross section of the neutrons. This allows radial resistance fluctuations to be strongly reduced, and the material may be used especially for high voltage applications, for example. The use of FZ materials for the serial production of IGBTs and diodes in the lower voltage range from 400V to 1200V is however, relatively expensive, and disk sizes are limited from reaching over 8 inches. For example, FZ-Si wafers larger than 300 mm are not produced.

In contrast, Czochralski CZ-Materials are manufactured more cheaply and wafer diameters of up to 12 inches are serially produced. However, the produced material shows a clearly higher contamination from oxygen in comparison to FZ material due to the high reactivity of Silicon. With the magnetic Czochralski-Material (MCZ), the effect of oxygen is clearly reduced through the use of a magnetic field during the doping process, and therefore the formation of oxygen precipitants is suppressed, for example.

In contrast to FZ materials, MCZ-Si shows nevertheless a clearly higher concentration of interstitial oxygen $[O_i]$. While typical values with FZ Si lie below $1 \times 10^{16}$ cm$^{-3}$, MCZ materials are about the order of 2 greater, for example. For example, values lie between $1 \times 10^{17}$ cm$^{-3}$ and $1 \times 10^{18}$ cm$^{-3}$. The interstitial oxygen leads to a build-up of thermal donors at temperatures between 300° C. und 550° C. through interaction with point defects (vacancies, self-Interstitials) in the Si-Lattice.

A distinction is made between deep thermal double donors (TDD) which are interpreted as oxygen complexes having three or more oxygen atoms, and shallow thermal donors (STDH) to which formation hydrogen is required and which are therefore observed e.g. after proton irradiation. Above 550° C., the thermal donors are not stable and dissolve. However, since back end of line (BEOL) process temperatures (e.g. from metal sintering and imide cycling) are in the range of between 300° C. und 400° C., their influence on the doping in the drift zone may be neglected only if the $[O_i]$-concentration stays sufficiently low (e.g. $\leq 3 \times 10^{17}$ cm$^{-3}$), for example.

In addition, interaction of the oxygen with the dopants which are used to achieve the specific resistance in the drift zone should be avoided, for example. For example, B doping with p-Type CZ-silicon used to manufacture solar cells may experience degradation of the carrier life time due to the buildup of B—O-complexes.

An n-doping of MCZ-Si (e.g. with P), is usually used as a basic (substrate) material for power components. As no P—O and/or Se complexes are observed, oxygen may be viewed as less detrimental. However, a difficulty exists in respect of the required relatively narrow tolerances of the dopant concentration of the final material, for the use as power components. The variation of the specific resistances are more than or equal to 15% for CZ materials due to the manufacturing process. The reason lies in the radial dopant fluctuations (striations) through the currents in the liquid phase, and in the variation over the rod, due to the segregation of dopant materials in the melt. The normal specification for the standard (default) used FZ material may however have a scattering of typically ±10%. However, the resistivity tolerance limits are 8% to 12% according to the specification of the data for different chip types.

The method 100 may be used to restrict tolerances by doping intrinsic or highly ohmic material with chalcogenides (S, Se, Te). A highly doped P-surface layer may be generated via a PH$_3$-deposition and an optional subsequent diffusion drive-in process which super saturates the lattice with self interstitials, causing the deep in-diffusion of the chalcogenide. By the doping of the highly ohmic MCZ-Wafers, e.g. with Se, no dependency of the doping effect due to the oxygen content in the produced materials is observed.

Even in direct comparison with FZ Si, under the same conditions, the same donor concentration at the base doping is measured.

A further consideration during the production of bipolar power components is the undesired reduction of the minority carrier lifetime. This may concern freewheeling diodes which may be optimized for a fast switching behavior in the parallel branch to the active switch e.g. an IGBT. This includes also device concepts in which the diode is monolithically integrated in the active circuit, e.g. in a reverse conducting IGBT (RC-IBGT). Heavy metals e.g. gold, Pt or Pd may be in-diffused in the drift zone of the semiconductor components. This may form impurities with deep energy levels up to the middle of the bandgap and lead to an effective increase in the recombination rate for electrons and holes, due to their capture cross section and energetic position.

The doping of the crystal lattice with recombination centers leads to the desired reduction of the switching losses. However, this may lead to an increase in the voltage drop $V_F$ under forward load (on state loss) and in the leakage current in the diode off state (blocking loss). For the latter, the exact location of the energy level of the recombination center in the band gap is crucial. A trade-off between switching losses and reverse current level may be assured by the use of Pt because of its decentralized energetic location in the band gap (i.e. between the valence band and the conduction band of silicon), compared to gold which is located almost exactly in the middle of the band gap. Pt may also be chosen if higher operating temperatures (e.g. 125-150° C.) are required, This reduces the need for a smaller heat resistance and an effective cooling to avoid thermal drift of the whole power conversion system like an IGBT-Module, and may be relieved by the method 100.

It may be important to know whether in MCZ Si only the one effective recombination center type at $E_C$=0.23 eV is formed by substitutional Pt atoms, or if other recombination centers may be created by a complex formation with oxygen. If such an effect would occur, the oxygen content of the base material may affect the electrical parameters of the diode directly which may be undesirable as the oxygen content of the rod vary in both the radial and in the axial direction.

For example, a Pt—O complex has a center that lies at $E_C$=0.52 eV, almost in the middle of the band gap. However, according to DLTS measurements, the energy level also fits well to a Pt—H complex, which may be formed by wet chemical etching of the samples before the deposition of a Schottky Metallization for the DLTS measurement. The hydrogen can diffuse up to a depth of about 5 μm without additional temperature treatment during preparation by wet-chemical etching. At about this depth, Pt—H-complexes may form. In the so-called Arrhenius evaluation of the DLTS measurement, the postulated Pt—O complex signature (energy level and capture cross section) coincides within the measurement accuracy with a center formed by a Pt—H complex. This may provoke doubt in respect to the existence of Pt—O centers. In particular, as experimental results show that the Se-diffused diode shows no difference in electrical behavior whether it is manufactured from a highly ohmic FZ or highly ohmic MCZ produced material.

The Pt—H complexes generated during wet chemical etching of DLTS-Probes may not naturally appear in real components, as the hydrogen does not penetrate to the base area. However, it is reasonable to expect interactions in a field stop zone introduced by proton irradiation. This is may be a part of the so called "short thin wafer processes" KDWP carried out after the completion of all processes on the wafer front side and after the Si thinning process (grinding & etching) to achieve the end thickness.

Electrically active Centers (i.e. Pt—H complexes) may be formed directly after the irradiation at tempering up to around 300° C. However, the Pt—H-complexes vanish again at temperatures between 300° C. and 370°. So these complexes should disappear during the usual KDWP Proton anneal at typical temperatures between 400° C. and 500° C. Consequently, with an appropriate process sequence no unwanted (disturbing) complexes remain in the finished processed component. Therefore, Se-deep diffusion for base doping of MCZ-Si in combination with Pt-Diffusion for life time adjustment in KDWP-Processes produces sufficiently narrow manufacturing tolerances which are comparable to the production standards of FZ Si.

If the Pt is introduced via ion implantation, it may further result in a smaller leakage current distribution. The reason for this may be due to a Pt decoration of slip lines whose density increases with increasing $PH_3$-deposition and/or diffusion temperature. For example, experiments with a 1200 V diodes show that a deposition temperature from 1050° C. in combination with a Pt standard diffusions process becomes already critical.

The method relates to forming a semiconductor device in which a highly ohmic MCZ-basic substrate material may be used, and by which through a chalcogenide deep diffusion (if necessary in combination with a pre doping with a n-dopant e.g. P) the basic doping is set, and additionally, over a heavy metal diffusion (Pt, Pd, Au) the life time is adjusted. The heavy metal may be incorporated through an ion implantation. In addition, the impact on leakage current distribution may be reduced or avoided if the $PH_3$ deposition temperature is reduced to less than or equal to 1050°.

It may be understood that even though the examples described herein described the doping region of the first conductivity type as being an n-type doping region and the doping region of the second conductivity type as being a p-type doping region, in other examples, the doping may also be reversed. For example, the doping region of the first conductivity type may be a p-type doping region and the doping region of the second conductivity type may be an n-type doping region.

Figure 2:
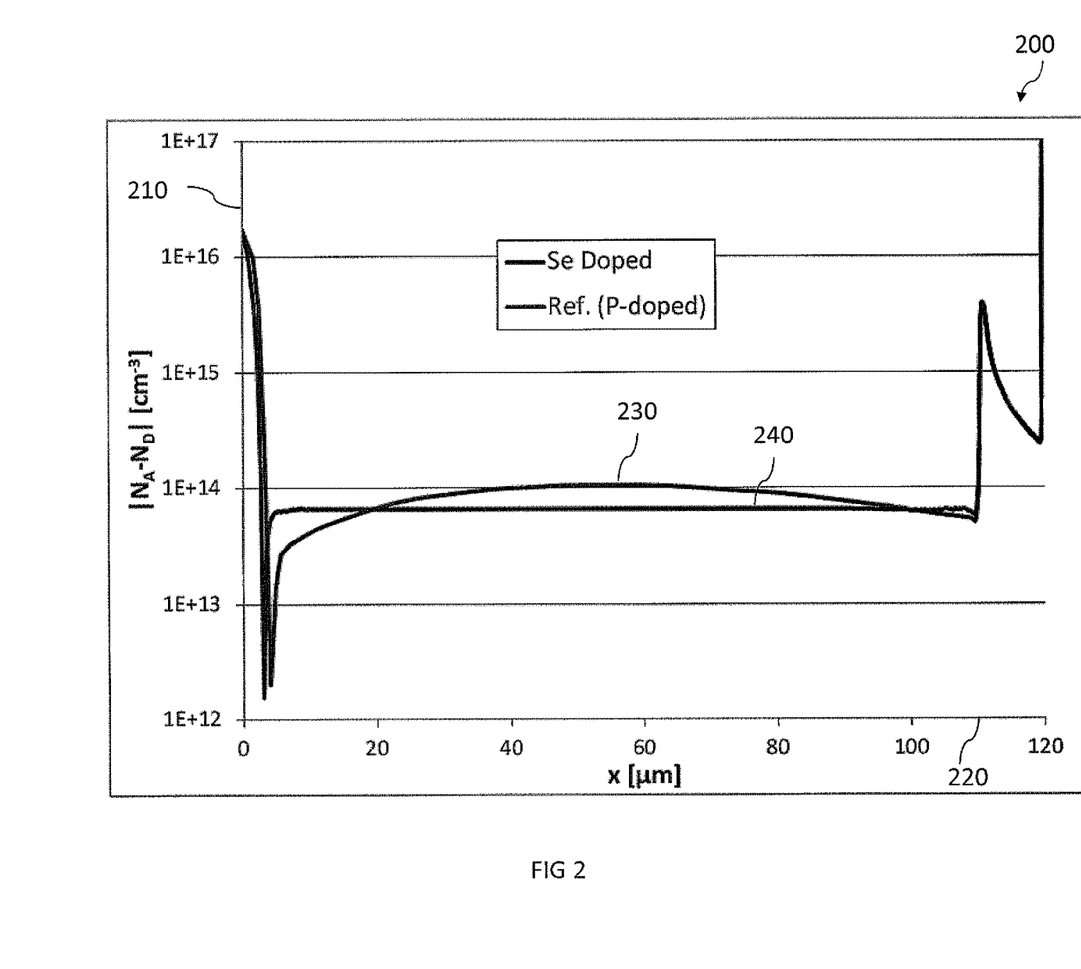
FIG. 2 shows a schematic illustration of dopant profile of a semiconductor device.

FIG. 2 shows a plot 200 of a doping profile of a demonstrator semiconductor device with deep diffused Se 230 and a reference semiconductor device 240 doped with phosphorus. FIG. 2 shows a plot of overall carrier concentration 210 in $cm^{-3}$ versus depth 220 in μm, for example. $|N_A-N_D|$ may represent an absolute value of a difference in acceptor concentration ($N_A$) and donor concentration ($N_D$), for example.

In an example, the demonstrator semiconductor device (a device with a Se-doped semiconductor doping region) may include a diode which may be rated for a nominal current of 100 A and a reverse voltage of 1200 V. With the Se-doped demonstrator diode, MCZ-Si with an initial resistivity value of 5700 Ωcm caused by a background n-dopant like e.g. P may be used (which may be co-doped with Se according to the method of FIG. 1). For the reference diode, FZ Si may be used, which may be pre-doped with the required resistivity value of 65 Ωcm. The dopant profile may be carried out (or obtained) at the (different) depths. An overall net charge carrier concentration of about $1\times10^{14}$ $cm^{-3}$ may be achieved in the drift region at a depth of e.g. between 10 μm and 120 μm. However, only about $1\times10^{12}$ $cm^{-3}$ of the Se atoms may be electrically active due to a lower activation level of Se atoms in Si.

More details and aspects are mentioned in connection with the embodiments described above or below (e.g. regarding the chalcogen atoms, the heavy metal atoms, the semiconductor substrate, the semiconductor doping region, the semiconductor device, the transistor doping regions, the field stop region, the dopant depth, the first average dopant concentration and the second average dopant concentration). The embodiment shown in FIG. 2 may comprise one or more optional additional features corresponding to one or more aspects mentioned in connection with the proposed concept or one or more embodiments described above (e.g. FIG. 1) or below (e.g. FIGS. 3 to 4B).

Figure 3:
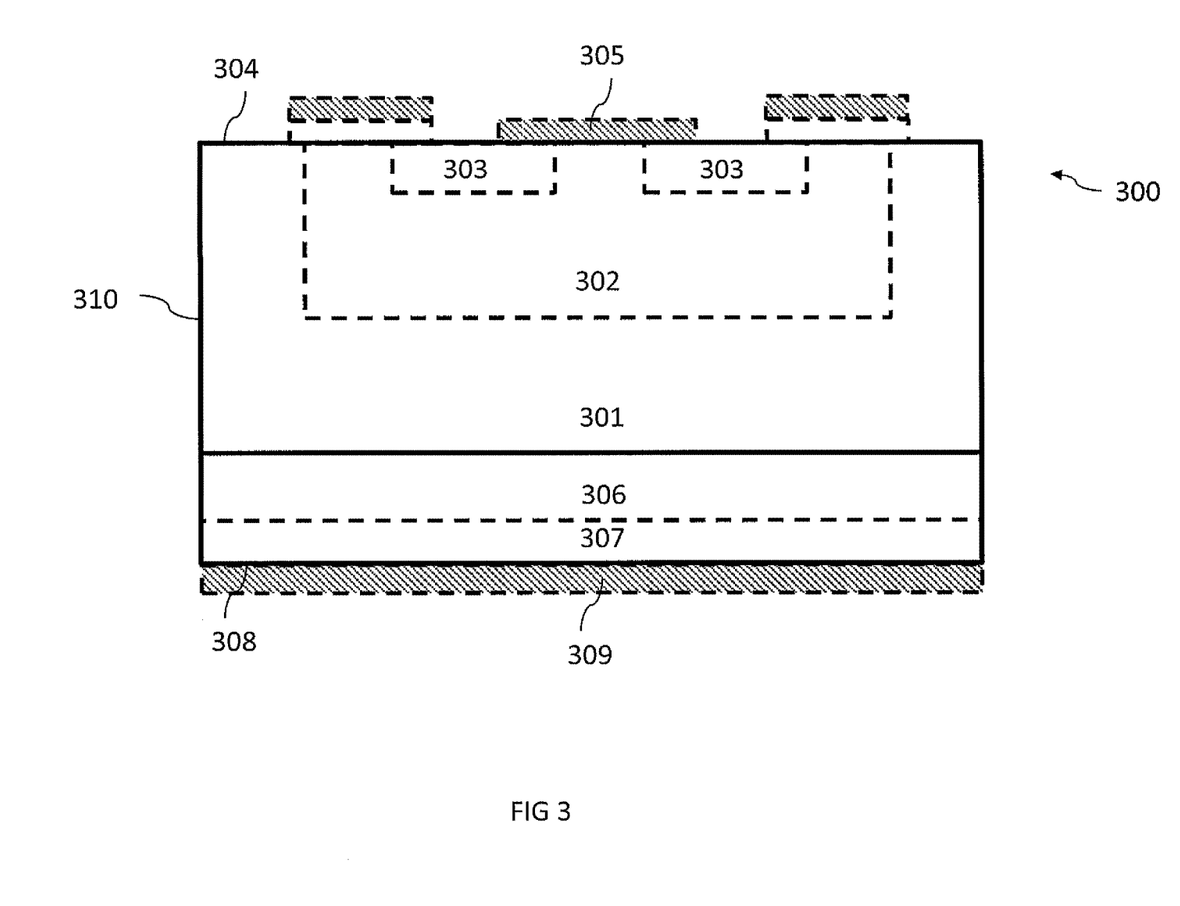
FIG. 3 shows a schematic illustration of a semiconductor substrate of a semiconductor device.

FIG. 3 shows a schematic illustration of a semiconductor substrate 300 according to an embodiment.

The semiconductor substrate 300 includes a semiconductor doping region 301 including chalcogen dopant atoms at a first average dopant concentration and heavy metal atoms at a second average dopant concentration.

Due to the inclusion of chalcogen dopant atoms and heavy metal atoms in the semiconductor doping region, the performance (e.g. switching behavior) of semiconductor devices (e.g. diodes, free-wheeling diodes or transistors) may be improved and degradation in semiconductor devices due to an undesirable formation of complexes may be reduced. Furthermore, doping values and minority carrier lifetime values may be reliably controlled with little dependence on impurities (e.g. oxygen concentration) in the semiconductor substrate, for example.

The chalcogen dopant atoms may be selenium atoms, sulfur atoms or tellurium atoms. The first average dopant concentration may lie between $1\times10^{12}$ cm$^{-3}$ and $5\times10^{14}$ cm$^{-3}$, or e.g. between $5\times10^{13}$ cm$^{-3}$ and $5\times10^{14}$ cm$^{-3}$, e.g. at $1\times10^{14}$ cm$^{-3}$. $^3$, for example, however a smaller concentration of Se atoms may be active (e.g. $1\times10^{12}$ cm$^{-3}$).

The heavy metal atoms may be platinum atoms, palladium atoms or gold atoms. The second average dopant concentration may lie between $5\times10^{11}$ cm$^{-3}$ and $1\times10^{14}$ cm$^{-3}$, or e.g. between $1\times10^{12}$ cm$^{-3}$ and $1\times10^{14}$ cm$^{-3}$, e.g. at $1\times10^{12}$ cm$^{-3}$.

The second average dopant concentration (of the heavy metal atoms) and the first average dopant concentration (of the chalcogen dopant atoms) may be different. For example, the first average dopant concentration may be greater than the second average dopant concentration.

The semiconductor substrate 300 may be part of a semiconductor device 310, e.g. a MOSFET or a IGBT structure, and the semiconductor doping region 301 may lie between a first electrode region and a second electrode region, for example.

In an example, the semiconductor device 310 may include the semiconductor doping region 301 including chalcogen dopant atoms at a first average dopant concentration and heavy metal atoms at a different second average dopant concentration. The semiconductor device 310 may include a transistor doping region 302 (e.g. a body region) of a second conductivity type (e.g. p-type) formed at the first side 304 of the semiconductor substrate, for example. The semiconductor device may further include a first transistor doping region 303 (e.g. an emitter region) of a first conductivity type (e.g. n-type or e.g. an n+ doped region) at the first side 304 of the semiconductor substrate 300, for example. The first transistor doping region 303 may be formed at least partially in the body region 302 and the body region 302 may be formed above and/or (directly) adjacent to the semiconductor doping region 301 (e.g. a lightly doped n-region, for example. The semiconductor device 310 may further include a first electrode region 305 at the first side 304 of the semiconductor substrate 300 electrically contacting the first transistor doping region 303. The semiconductor device 310 may further include a field stop doping region 306 of a first conductivity type (e.g. n-type or e.g. heavily doped n+ doped region) adjacent (e.g. directly adjacent) to the semiconductor doping region 301. The semiconductor doping region 301 may lie between the body region 302 and the field stop doping region 306, for example. The semiconductor device 310 may further include a second transistor doping region 307 (e.g. a collector region) of a second conductivity type (e.g. a heavily doped p+-type region) adjacent (e.g. directly adjacent) to the field stop doping region 306 at a second side 308 of the semiconductor substrate 300. The second side 308 may be opposite to the first side 304. The semiconductor device 310 may further include a second electrode region 309 at the second side 308 (e.g. over the second surface) of the semiconductor substrate 300 contacting the second transistor doping region 307.

The forward voltage, blocking voltage and the leakage current of semiconductor substrates having the semiconductor doping region may be observed by measuring a batch of demonstrator semiconductor devices (e.g. diodes) processed according to the method of FIG. 1, and reference semiconductor devices. For a batch of 1200 V demonstrator diodes, all electrical data from the batch may lie within the specification boundaries. For example, a median forward voltage value of diodes processed according to the method 100 may have a forward voltage $V_F$ between 1.85 and 1.95 V at 100 A, for example. The leakage current $I_R$ at 1260 V may be between $3\times10^{-8}$ A and $1\times10^{-7}$ A, for example. The blocking voltage $V_R$ at 200 µA may be between 1320 V and 1420 V, for example. A wider distribution of $V_R$ and $I_R$ values may be observed in the semiconductor substrates compared to other reference substrates due to the splitting related to the PH$_3$-deposition and/or diffusion temperature. However, the $V_F$, $I_R$ and $V_R$ values lie within the tolerances required from FZ silicon diodes, for example.

More details and aspects are mentioned in connection with the embodiments described above or below (e.g. regarding the chalcogen atoms, the heavy metal atoms, the semiconductor substrate, the semiconductor doping region, the semiconductor device, the transistor doping regions, the field stop region, the dopant depth, the first average dopant concentration and the second average dopant concentration). The embodiment shown in FIG. 3 may comprise one or more optional additional features corresponding to one or more aspects mentioned in connection with the proposed concept or one or more embodiments described above (e.g. FIGS. 1 to 2) or below (e.g. FIGS. 4A to 4B).

Figure 4A:
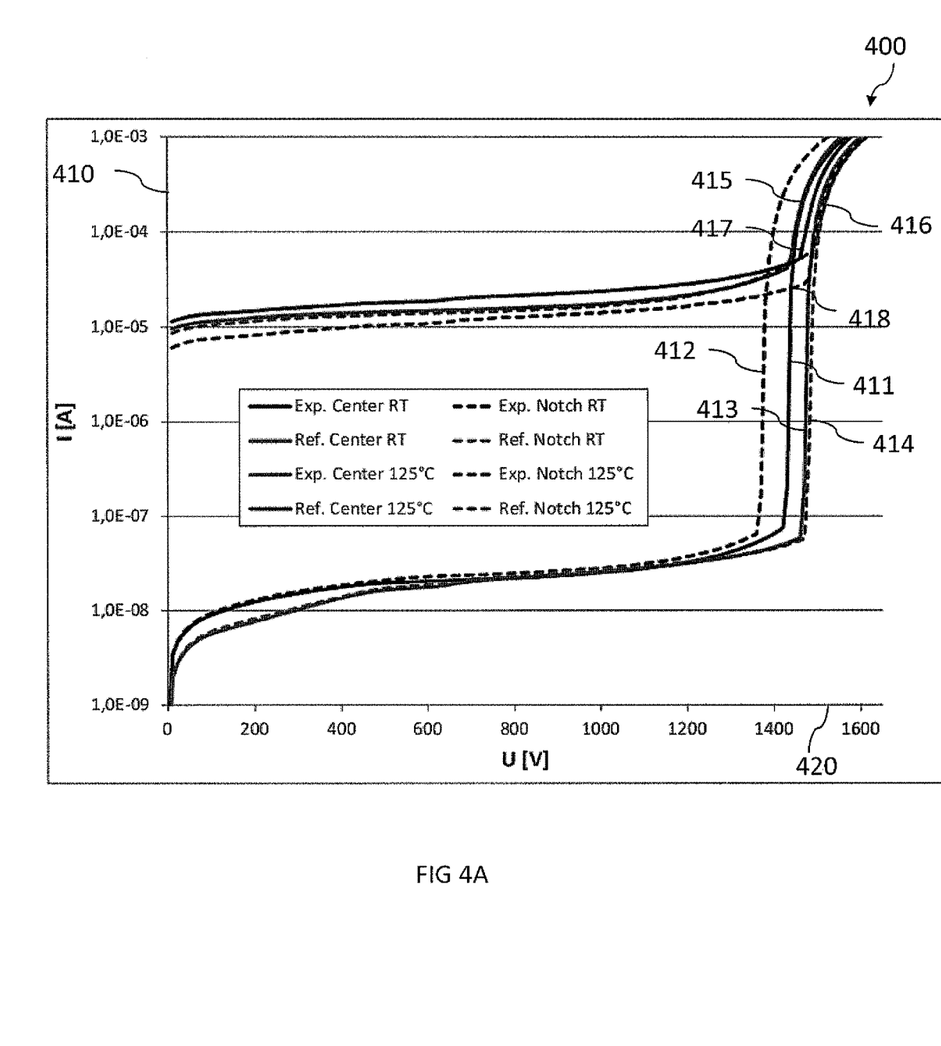
FIG. 4A shows blocking characteristics of wafer-edge and wafer-center semiconductor devices at a processing temperature of 1000° C.
Figure 4B:
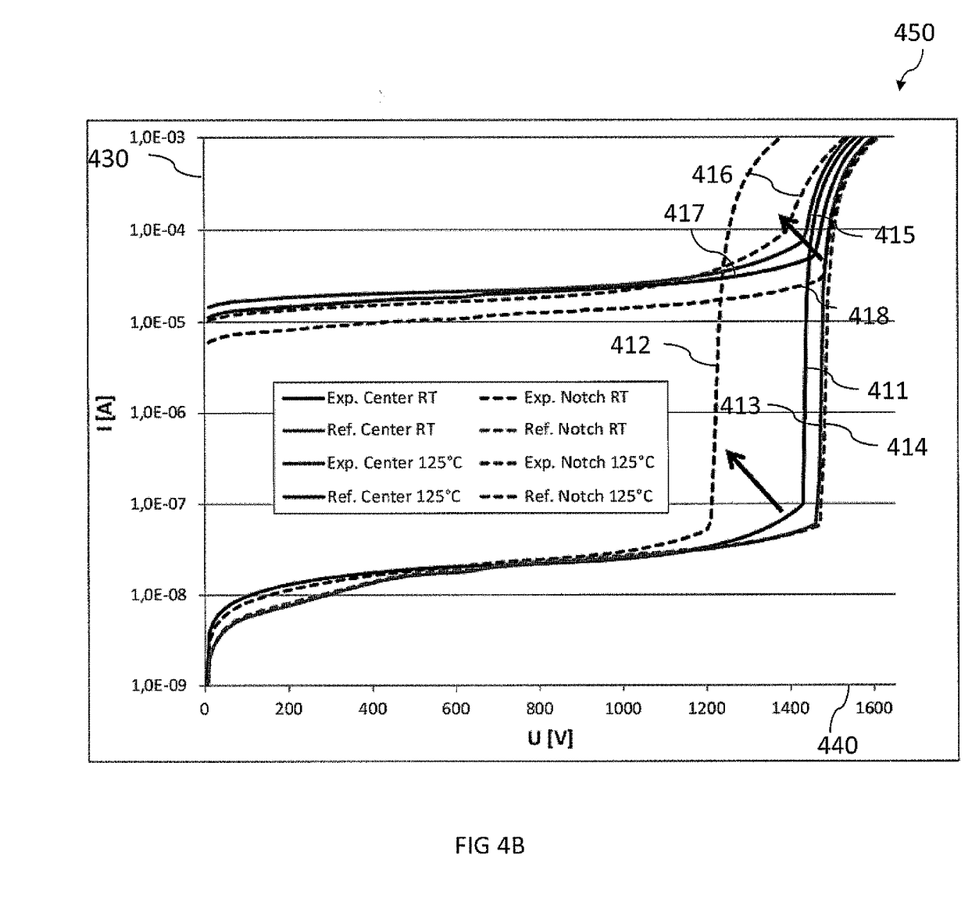
FIG. 4B shows blocking characteristics of wafer-edge and wafer-center semiconductor devices at a processing temperature of 1050° C.

FIG. 4A and FIG. 4B show blocking characteristics of the demonstrator semiconductor devices (e.g. diodes) and reference semiconductor devices (e.g. diodes). The dashed lines represent notch (or edge) devices, and the solid lines represent devices taken from the wafer center.

FIG. 4A shows a plot 400 of leakage current in amperes (A) 410 versus reverse voltage in volts (V) 420. FIG. 4A shows blocking characteristics measured at room temperature and at 125° C. of a wafer (or diode) with a PH$_3$-deposition and/or diffusion temperature from 1000° C. taken from a batch of 1200V demonstrator diodes and of a reference wafer (or diode). The measurements are taken from the wafer middle (center) region and at the wafer edge (notch) region, for example.

FIG. 4B shows a plot 450 of leakage current in amperes (A) 430 versus reverse voltage in volts (V) 440. FIG. 4B shows blocking characteristics where the PH$_3$-deposition temperature is 1050° C. or more.

Plot 411 represents the blocking measurements at room temperature of a demonstrator semiconductor device from a wafer center (Exp. Center RT).

Plot 412 represents the blocking measurements at room temperature of a demonstrator semiconductor device from a wafer edge (Exp. Notch RT).

Plot 413 represents the blocking measurements at room temperature of a reference semiconductor device from a wafer center (Ref. Center RT).

Plot 414 represents the blocking measurements at room temperature of a reference semiconductor device from a wafer edge (Ref Notch RT).

Plot 415 represents the blocking measurements at 125° C. of a demonstrator semiconductor device from a wafer center (Exp. Center 125° C.).

Plot 416 represents the blocking measurements at 125° C. of a demonstrator semiconductor device from a wafer edge (Exp. Notch 125° C.).

Plot 417 represents the blocking measurements at 125° C. of a reference semiconductor device from a wafer center (Ref. Center 125° C.).

Plot 418 represents the blocking measurements at 125° C. of a reference semiconductor device from a wafer edge (Ref Notch 125° C.).

In general, the chip at the wafer edge shows an increase in the leakage current at higher voltages, and an associated decrease in the blocking voltage in contrast to the chip in the wafer middle, and in comparison to a reference edge chip. A systematic middle to edge effect may be observed. The blocking characteristics in the leakage current behaviors show a clear difference between chips from the wafer middle and from the wafer edge (FIGS. 4A and 4B).

The difference becomes more pronounced when higher underlying $PH_3$-deposition and/or diffusion temperatures (FIG. 4B) are used. This may be shown by larger leakage currents at chips in notch position (shown by the arrows) if the PH3-deposition and/or diffusion temperature is 1050° C. or more.

This effect may further be confirmed by wafer maps. For example, for the parameter $I_R$ at 1260V, there may be almost no chips with a leakage current greater than 100 nA when 1000° C. (temperature)-deposition is used. However, the number of bad chips increases clearly at 1050° C. (temperature) loading, and the number of fail chips may also increase (In FIG. 4B). The fail chips lie predominantly in the wafer edge.

With increasing $PH_3$-deposition and/or diffusion temperature, the density of the slip lines which arise at high temperature processes may also increase. Furthermore, they may be decorated with heavy metal atoms during the Pt-Diffusion. How the recombination rate increases with heavy metal decoration may be quantified based on an EBIC (Electron Beam Induced Current) measurement. The dislocation lines may start from the wafer edge and here, mainly from (critical) supporting points of the wafer boat used in the diffusion process.

Slip lines may also be observed in a SIRD measurement (Scanning Infra-Red De-polarization). SIRD measurement of wafers with $PH_3$-deposition and/or diffusion temperature at about 1000° C., e.g. 1050° C., shows that at higher temperatures, a higher dislocation density occurs at the edge region of the wafer, for example. At lower temperatures, (besides at the support points and handling related scratches) hardly any abnormalities are observed, for example.

An improvement of the leakage current distribution may be expected near the limit of the thermal budget and through the introduction of a Pt implantation processes. The setting of $V_F$ may be attained through a corresponding increase of temperature (in comparison to the values of Pt in-diffusion from Pt silicide) at relatively low doping values (in the range of several $10^{12}$ cm$^{-2}$ to several $10^{13}$ cm$^{-2}$). Practically the whole Pt amount may be substitutionally incorporated, and through the lack of excess heavy metal atoms (like by infinite source, where the available doses may range from values of about $10^{16}$ cm$^{-2}$) no significant supply is available to decorate the slip lines. This may also be shown through parallel experiments by substituting a classic (e.g. diffusions) Pt Process of a productive diode with an ion implantation process. Analytical methods like deep level transient spectroscopy (DLTS), spreading resistance probe (SRP) measurements, SIRD and ERIC may also be used for proof of the suggested process sequence.

More details and aspects are mentioned in connection with the embodiments described above or below (e.g. regarding the chalcogen atoms, the heavy metal atoms, the semiconductor substrate, the semiconductor doping region, the semiconductor device, the transistor doping regions, the field stop region, the dopant depth, the first average dopant concentration and the second average dopant concentration). The embodiment shown in FIGS. 4A and 4B may comprise one or more optional additional features corresponding to one or more aspects mentioned in connection with the proposed concept or one or more embodiments described above (e.g. FIGS. 1 to 3) or below.

Various examples relate to a Pt—Se codoping of MCZ silicon.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The invention claimed is:

1. A method for forming a semiconductor device, the method comprising:
incorporating chalcogen dopant atoms into a semiconductor doping region of a semiconductor substrate of a semiconductor device; and
incorporating heavy metal atoms into the same semiconductor doping region into which the chalcogen dopant atoms are incorporated,
wherein the semiconductor substrate comprises silicon having an electrical resistivity between 500 Ωcm and 6000 Ωcm before incorporating the chalcogen dopant atoms and the heavy metal atoms.

2. The method according to claim 1, wherein the chalcogen dopant atoms are selenium atoms, tellurium atoms or sulfur atoms.

3. The method according to claim 1, wherein the heavy metal atoms are platinum atoms, palladium atoms or gold atoms.

4. The semiconductor substrate according to claim 1, wherein the semiconductor substrate comprises an oxygen interstitial content between $1\times10^{17}$ cm$^{-3}$ and $1\times10^{18}$ cm$^{-3}$.

5. The method according to claim 1, wherein incorporating the chalcogen dopant atoms into the semiconductor doping region comprises: supersaturating a silicon lattice of the semiconductor substrate with self-interstitials; and heating the semiconductor substrate for a deep diffusion of the chalcogen dopant atoms into the semiconductor doping region.

6. The method according to claim 5, comprising supersaturating a silicon lattice of the semiconductor substrate with self-interstitials by forming a defect-inducing layer over a surface of the semiconductor substrate.

7. The method according to claim 6, comprising providing phosphorous dopant atoms for forming the defect-inducing layer comprising phosphorous before or during the incorporating of the chalcogen dopant atoms.

8. The method according to claim 1, comprising incorporating the chalcogen dopant atoms to a dopant depth of between 20 μm to 500 μm from a surface of the semiconductor substrate.

9. The method according to claim 1, comprising incorporating the chalcogen dopant atoms into the semiconductor doping region at a first average dopant concentration and incorporating the heavy metal atoms into the semiconductor doping region at a second average dopant concentration, wherein the first average dopant concentration and the second average dopant concentration are different.

10. The method according to claim 1, wherein the chalcogen dopant atoms are implanted at a dosage concentration between $1\times10^{14}$ cm$^2$ and $5\times10^{14}$ cm$^2$.

11. The method according to claim 1, wherein the heavy metal atoms are implanted at a dosage concentration between $1\times10^{12}$ cm$^2$ and $1\times10^{14}$ cm$^2$.

12. The method according to claim 1, comprising incorporating dopant atoms into one or more diode regions or transistor doping regions of the semiconductor device, wherein the dopant atoms for forming the one or more diode regions or transistor doping regions are different from the chalcogen dopant atoms and the heavy metal atoms.

13. The method according to claim 5, wherein a final dopant depth reached by the chalcogen dopant atoms by the deep diffusion is 500 to 5000 times greater than the depth reached by the chalcogen dopant atoms by ion implantation performed prior to the deep diffusion.

14. The method according to claim 1, wherein the semiconductor doping region has an n-type conductivity due to the chalcogen dopant atoms.

15. The method according to claim 1, wherein incorporating heavy metal atoms into the same semiconductor doping region into which the chalcogen dopant atoms are incorporated comprises: forming a platinum silicide layer over a side or surface of the semiconductor substrate; and heating the semiconductor substrate to diffuse platinum out of the platinum silicide layer and into the semiconductor doping region.

16. The method according to claim 9, wherein the first average dopant concentration is greater than the second average dopant concentration.

17. The method according to claim 1, wherein the concentration of the heavy metal atoms varies by less than 10% at a depth between 100 μm to 500 μm.

18. The method according to claim 1, comprising forming a body region of a vertical IGBT structure directly adjacent the semiconductor doping region.

19. The method according to claim 18, comprising forming a field stop doping region of the vertical IGBT structure directly adjacent the semiconductor doping region at a side of the semiconductor doping region opposite the body region.

* * * * *